United States Patent [19]
Mizutani et al.

[11] Patent Number: 5,496,582
[45] Date of Patent: Mar. 5, 1996

[54] PROCESS FOR PRODUCING ELECTROLUMINESCENT DEVICE

[75] Inventors: Atsushi Mizutani, Aichi; Masayuki Katayama, Handa; Nobuei Ito, Chiryu; Tadashi Hattori, Okazaki, all of Japan

[73] Assignee: Nippondenso Co., Ltd., Kariya, Japan

[21] Appl. No.: 298,164

[22] Filed: Aug. 30, 1994

[30] Foreign Application Priority Data

Aug. 30, 1993 [JP] Japan ................... 5-213935

[51] Int. Cl.$^6$ ...................... B05D 5/06
[52] U.S. Cl. ................ 427/66; 427/67; 427/126.1; 427/157; 427/255.2
[58] Field of Search .............. 427/66, 67, 126.1, 427/157, 255.2

[56] References Cited

U.S. PATENT DOCUMENTS

| | | | |
|---|---|---|---|
| 4,981,712 | 1/1991 | Yamamoto et al. | 427/58 |
| 5,312,983 | 5/1994 | Brown et al. | 562/899 |

FOREIGN PATENT DOCUMENTS

| | | | |
|---|---|---|---|
| 63-230869 | 9/1988 | Japan | H05B 33/10 |
| 1163995 | 6/1989 | Japan | H05D 33/10 |
| 377639 | 12/1991 | Japan | H05B 33/10 |

OTHER PUBLICATIONS

P. Soininen et al., "Blue Electroluminescence of SrS:Ce, SiCl, Thin Films Grown by Atomic Layer Epitaxy," The International Display Research Conference Proceedings, Aug. 31–Sep. 3, 1993, pp. 511–514.

K. Hirabayashi et al., "ZnS:Mn Electroluminescent Device Prepared by Metal–Organic Chemical Vapor Deposition," Jap. Journ. Appl. Phys. May 1986 pp. 711–713.

Kaliski et al., J. Appl. Phys 62(3), 1 Aug. 1987 pp. 998–1005.

*Primary Examiner*—Benjamin Utech
*Attorney, Agent, or Firm*—Cushman, Darby & Cushman

[57] ABSTRACT

A process for producing an electroluminescent device comprising a luminescent layer located between two electrodes formed on an insulating substrate wherein the luminescent layer is composed of a host material to which a luminescent center element is added and the host material is composed of an alkaline earth metal element of the Group II of the Periodic Table and an element of the Group VI, which process comprises forming the host material by chemical vapor deposition to react a gas of an organic compound containing the alkaline earth metal element of the Group II and a gas of a compound containing the element of the Group VI in a reactor, the gas of the organic compound containing the alkaline earth metal element of the Group II being formed from a cyclopentadienyl compound. By this process, EL devices can be produced with high reproducibility.

17 Claims, 7 Drawing Sheets

PROCESS FOR PRODUCING ELECTROLUMINESCENT DEVICE

BACKGROUND OF THE INVENTION

1. Field of the Invention

This invention relates to a process for producing an electroluminescent device. More particularly, it relates to a process for producing an electroluminescent device which is used for segment display or matrix display of a light-emitting type in measuring instruments, or a display of various information terminal devices.

2. Description of the Related Art

Electroluminescent devices (hereinafter referred to as "EL devices") according to the prior art utilize the phenomenon that light is emitted when an electric field is applied to a phosphor such as zinc sulfide (ZnS), etc., and have drawn increasing attention as a component for constituting a light-emitting flat-panel display.

FIG. 7 of the accompanying drawings is a schematic view showing a typical sectional structure of an EL device 10 according to the prior art.

This EL device 10 is formed by sequentially laminating a first electrode 2 consisting of an optically transparent ITO film, a first insulating layer 3 made of tantalum pentaoxide ($Ta_2O_5$), etc., a luminescent layer 4, a second insulating layer 5 and a second electrode 6 consisting of the ITO film on a glass substrate 1 as an insulating substrate.

The ITO (Indium Tin Oxide) film is a transparent conductor film obtained by doping tin (Sn) into a indium oxide ($In_2O_3$) and having a low resistivity. Accordingly, this film has seen wide application in the past as a transparent electrode.

A material used for the luminescent layer 4 contains strontium sulfide as a host material, and cerium (Ce) added as a luminescent center.

Light emission colors of the EL device are determined by the kind of dopants in strontium sulfide, and when cerium (Ce) is added as the luminescent center, for example, light emission of a blue-green color can be obtained. When this blue-green color light emission is passed through a filter which cuts light having a wavelength of longer than 500 nm, for example, blue light emission can be obtained.

To obtain blue color emission light in the EL device 10 having the structure described above, a sulfur compound of an alkaline earth metal such as strontium sulfide containing cerium (Ce) added thereto or strontium selenide and a selenium compound have been used in the past as the constituent material of the luminescent layer 4. As the method of producing the luminescent layer 4, electron beam (EB) vacuum deposition and sputtering have been examined, and recently, CVD (Chemical Vapor Deposition) has also been examined.

In this CVD process, a method of transporting a heated metal by a halogen element gas and a method of vaporizing a halogen compound at a high temperature and transporting it into a reaction furnace are known as the method of supplying the alkaline earth metal.

According to the methods described above, however, the vaporization temperature is high and the control of the vaporization quantity is difficult. Further, there is a high possibility that the ratio of the gases of the Groups II and VI to the luminescent center substance supplied into the reaction furnace may change, so a high quality light emission layer cannot be obtained stably.

As a method of solving this problem, the method described, e.g., in SID 91 DIGEST, pp. 282–285, which uses chemical vapor deposition using $Sr(thd)_2$ as a precursor for strontium can be used. Generally, $Sr(thd)_2$ has a melting point of not higher than 250° C., and can improve temperature controllability to obtain a vapor of the precursor in comparison with the halogen compounds described above.

However, thd (2,2,6,6-tetramethyl-3,5-heptanedione) chelates of alkaline earth metals have a characteristic property such that when the temperature for heating the precursors is increased, the vaporization quantity also increases, but they are decomposed before a sufficient vaporization quantity is obtained.

Accordingly, in order to transport the precursor into the reaction furnace without causing the change of the form of the precursor, heating and vaporization must be attained at a temperature below the decomposition temperature and in this case, a sufficient feed quantity of the precursor for the alkaline earth metal cannot be obtained.

When a thin film of strontium sulfide (SrS) or strontium selenide (SrSe) is formed, for example, a sufficient film growth rate cannot be obtained, and the problem that the film formation time is too long occurs.

Further, when dopants such as the luminescent center are added into the thin film, their amounts must be controlled so that they become about a few at% on the basis of the atomic weight of the thin film. When the composition of the dopants such as the luminescent center changes even slightly, the light emission characteristics of the resulting EL device greatly change, and reliability is greatly deteriorated. In order to add a predetermined amount of the dopants to the thin film in a uniformly distributed state, therefore, the feed quantity must be controlled to a lower level than the host material constituent gas, and a large-scale apparatus becomes necessary for delicate control of the amount of the vaporization temperature of the precursors for feeding the dopants.

Because of various problems described above, it has not been possible to obtain a sufficient feed quantity of the precursor for the alkaline earth metal compounds, and to improve the thin film growth rate. In other words, a luminescent layer thin film having high reliability cannot be obtained by chemical vapor deposition.

SUMMARY OF THE INVENTION

To eliminate the problems described above, the present invention aims at providing a process for producing an EL device which can produce the EL device with high reproducibility.

To accomplish the object described above, the present invention provides a process for producing an electroluminescent device comprising a luminescent layer located between two electrodes formed on an insulating substrate wherein the luminescent layer is composed of a host material to which a luminescent center element is added and the host material is composed of an alkaline earth metal element of the Group II of the Periodic Table and an element of the Group VI, which process comprises forming the host material by chemical vapor deposition to react a gas of an organic compound containing the alkaline earth metal element of the Group II and a gas of a compound containing the element of the Group VI in a reactor, the gas of the organic compound containing the alkaline earth metal element of the Group II being formed from a cyclopentadienyl compound.

DESCRIPTION OF THE PREFERRED EMBODIMENTS

In the process of the present invention, a precursor for the alkaline earth metal compound may preferably be a gas of bis-pentamethylcyclopentadienyl strontium-THF adduct $(Sr(Me-Cp)_2THF_2)$, bis-pentamethylcyclopentadienyl calcium-THF adduct $(Ca(Me-Cp)_2THF_2)$ or bis-pentamethylcyclopentadienyl barium-THF adduct $(Ca(Me-Cp)_2THF_2)$, or of an adduct as mentioned above but containing 1,3-dioxolane instead of THF. Here, THF refers to tetrahydrofuran.

A film formation substrate temperature at the time of forming a luminescent layer is preferably from 300° C. to 550° C.

A pressure for evaporating the cyclopentadienyl compounds of the alkaline earth metals is preferably not higher than 100 Torrs.

When the light emission layer is formed, a halogen gas or a halogenated hydrogen gas is preferably introduced into a reactor separately from other gases.

When the luminescent layer consisting of the alkaline earth metal element of the Group II of the Periodic Table and the element of the Group VI, to which the luminescent center element is added, is subjected to the film formation by the chemical vapor deposition, the process of the present invention uses the cyclopentadienyl compound having a low melting point as a material for supplying a gas of the alkaline earth metal of the Group II. Accordingly, the vaporization point of the precursor can be reduced, and the vapor pressure rises. Further, controllability can also be improved.

Accordingly, the feed quantity of the gas of the alkaline earth metal compound can be increased. In other words, the film growth rate of the thin film can be increased by using the compound described above, and its accuracy can also be improved.

As a result, variance of the addition amounts of the luminescent center material, etc., in the thin film can be improved in comparison with the prior art process.

In not only the chemical vapor phase deposition apparatus but also in those apparatuses which must supply the gas at a high temperature, the cyclopentadienyl compound of the alkaline earth metal can provide a sufficient vaporization quantity even at a temperature not higher than 150° C. In the valve for controlling the flow of the gas, for example, the limitation to the valves that can be employed can be mitigated, and valves having higher accuracy can be used, so that reliability can be improved.

Hereinafter, the present invention will be explained in further detail with reference to definite examples thereof.

EXAMPLE 1

Figure 1:
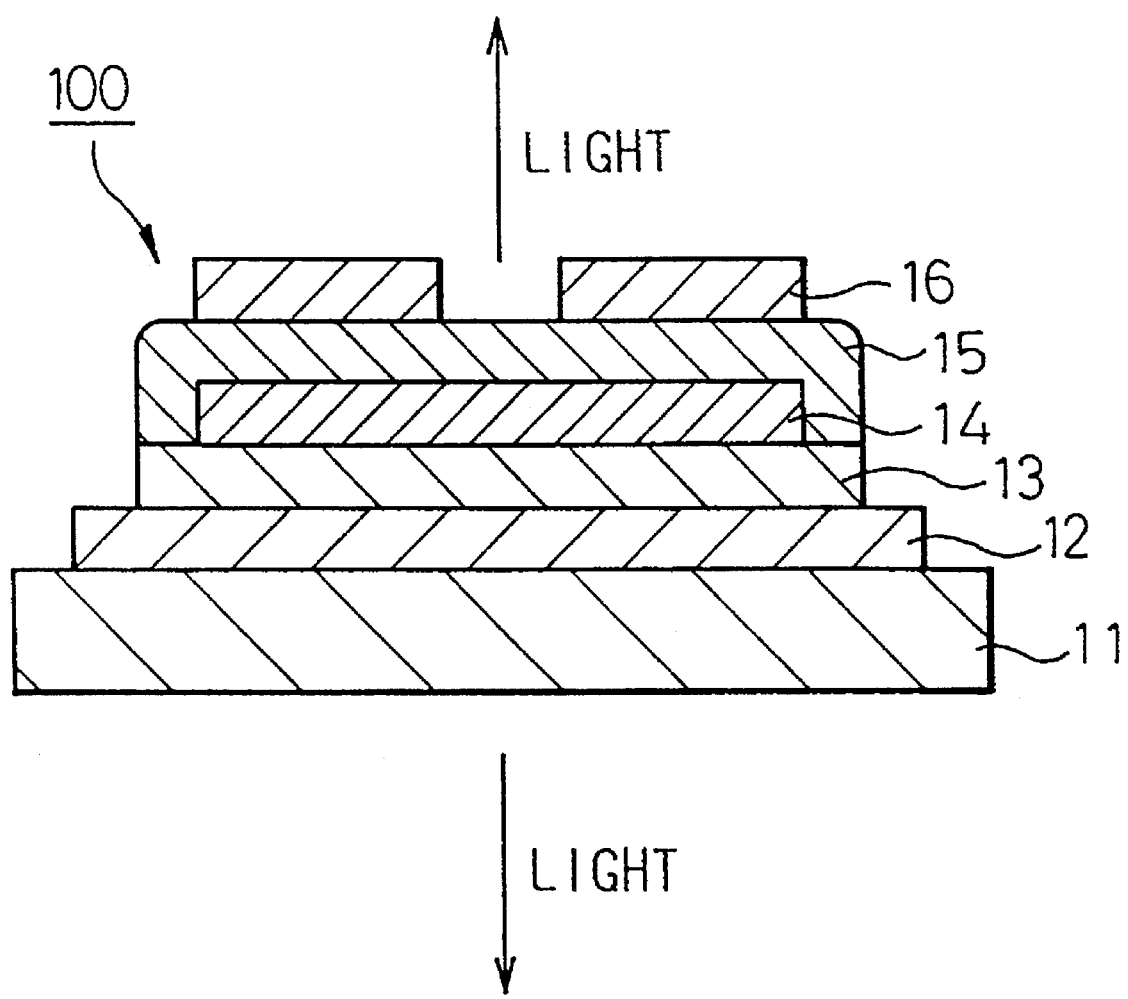
FIG. 1 is a schematic view showing a longitudinal section of an electroluminescent device according to the first embodiment of the present invention.

FIG. 1 is a schematic view showing the section of an EL device according to the present invention. In the EL device 100 shown in FIG. 1, light is picked up in the direction represented by an arrow.

The thin film EL device 100 was formed by sequentially laminating the following thin films on a glass substrate 11 as an insulating substrate. Incidentally, the film thickness of each layer was expressed by the thickness at its center as a reference.

A first transparent electrode (first electrode) 12 consisting of optically transparent zinc oxide (ZnO) was formed on the glass substrate 11. A first insulating layer 13 consisting of optically transparent tantalum pentaoxide $(Ta_2O_5)$, a luminescent layer 14 consisting of strontium sulfide (SrS) containing cerium (Ce) added as the luminescent center, and zinc sulfide (ZnS), a second insulating layer 15 consisting of optically transparent tantalum pentaoxide $(Ta_2O_5)$ and a second transparent electrode (second electrode) 16 consisting of optically transparent zinc oxide (ZnO) were sequentially formed on the upper surface of the first electrode 12.

Next, a process for producing the thin film EL device 100 described above will be explained.

First, the first transparent electrode 12 was formed on the glass substrate 11. A product formed by mixing gallium oxide $(Ga_2O_3)$ with zinc oxide (ZnO) powder and molding the mixture into a pellet was used as the vacuum deposition material, and an ion plating apparatus was used as the film formation apparatus.

More concretely, while the temperature of the glass substrate 11 described above was kept constant, the inside of the ion plating apparatus was evacuated to produce a vacuum. Thereafter, an argon (Ar) gas was introduced, and while the pressure was kept constant, beam power and radio frequency power were regulated so that the film formation rate existed within a predetermined range.

Next, the first insulating layer 13 consisting of tantalum pentaoxide $(Ta_2O_5)$ was formed by sputtering on the first transparent electrode 12.

More definitely, the temperature of the glass substrate 11 was kept constant, and a mixed gas of argon (Ar) and oxygen $(O_2)$ was introduced into the sputtering apparatus. The film formation was carried out at radio frequency power of 1 KW.

A thin film consisting of zinc sulfide (ZnS), that constituted the luminescent layer 14 and was not shown in the drawing, and having a relatively high moisture resistance was formed on the first insulating layer 13 by metal organic chemical vapor deposition (MOCVD).

Figure 2:
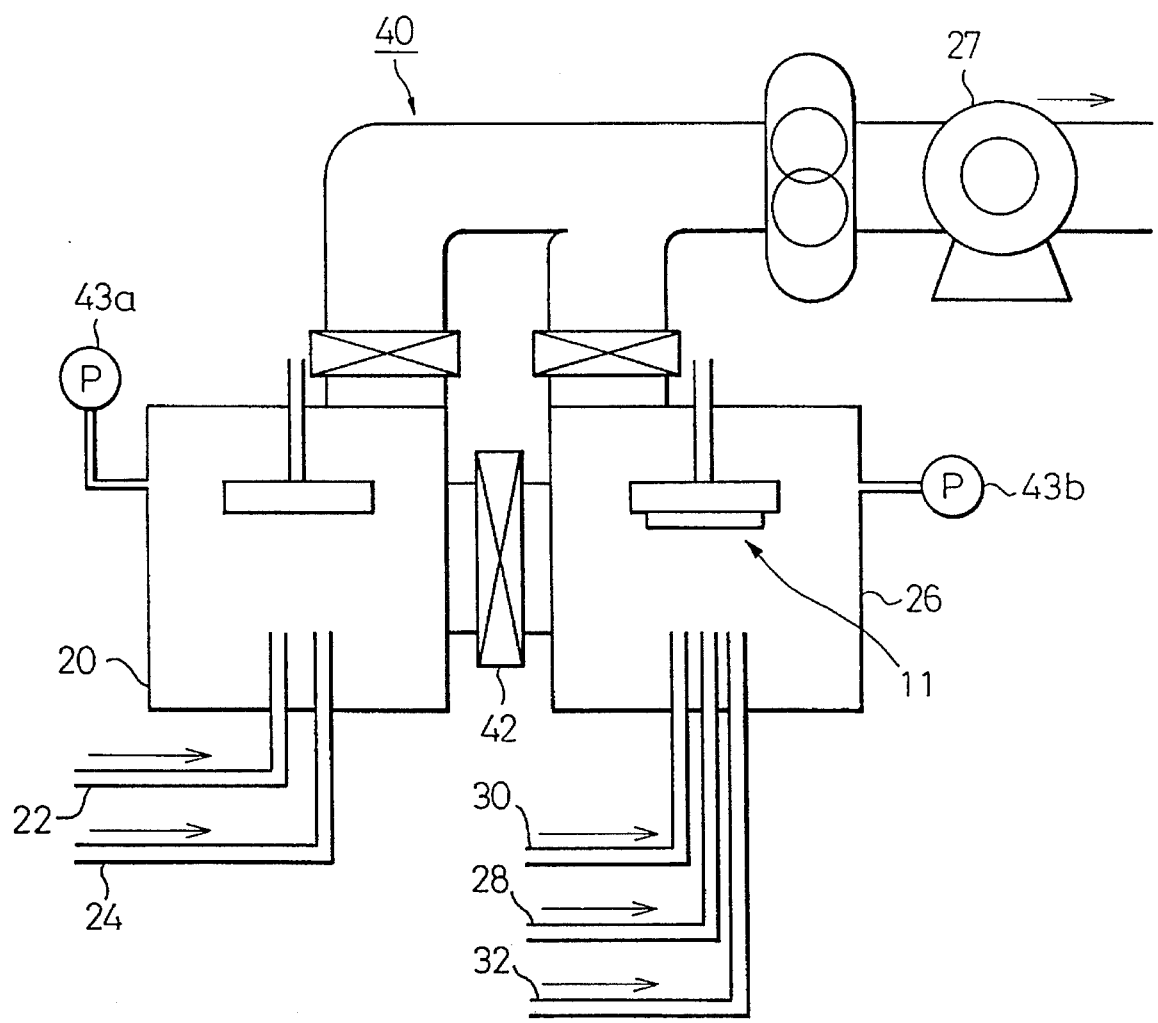
FIG. 2 is a schematic view showing a metal organic chemical vapor (deposition) apparatus used for forming a luminescent layer of an electroluminescent device according to the first embodiment of the present invention.

In other words, while the glass substrate 11 was kept at a constant temperature, the zinc sulfide (ZnS) film formation chamber 20 shown in FIG. 2 was brought into a reduced pressure atmosphere, and diethylzinc $(Zn(CH_2H_5)_2)$ using a hydrogen gas carrier and hydrogen sulfide (H$_2$S) diluted with hydrogen were caused to flow through first and second inlet pipes 22 and 24, respectively, so as to form a thin film of zinc sulfide (ZnS) having a film thickness of not greater than 150 nm.

After the layers up to the zinc sulfide layer (ZnS) were formed, the glass substrate 11 was conveyed into a strontium sulfide (SrS) film formation chamber 26 shown in FIG. 2, a cerium-doped strontium sulfide (SrS:Ce) luminescent layer 14 using strontium sulfide (SrS) as a base material and containing cerium (Ce) added as a luminescent center was formed by MOCVD in succession to the formation of the zinc sulfide (ZnS) thin film.

More definitely, the glass substrate 11 was kept at a constant temperature of not higher than 550° C., and the inside of the strontium sulfide (SrS) film formation chamber 26 was brought into a reduced pressure atmosphere by a pump 27. Thereafter, the gas of bis-pentamethylcyclopentadienyl strontium-THF adduct (Sr(Me-Cp)$_2$·THF$_2$) was caused to flow through a third inlet pipe 28 by using a hydrogen carrier gas, and hydrogen sulfide (H$_2$S) diluted with hydrogen was caused to flow through a fourth inlet pipe 30.

At this time, the internal pressure of a precursor evaporator of bis-pentamethylcyclopentadineyl strontium (Sr(Me-Cp)$_2$·THF$_2$) was kept constant between 30 and 50 Torrs, and after confirming that the temperature was stabilized at a temperature not higher than 150° C. by heating, the precursor was fed into the reaction chamber by using the hydrogen (H$_2$) gas as the carrier gas so as to regulate the thin film formation rate.

In order to add the luminescent center, tridipivaloylmethanized cerium (Ce·(DPM)$_3$) was introduced into the reaction chamber through a fifth inlet pipe 32.

The reason why the glass substrate 11 was kept at a temperature below 550° C. was as follows.

When the temperature of the glass substrate 11 was higher than 550° C., a problem occurred in that the resistance of the ITO increased, or the substrate itself underwent warp, and if the temperature was lower than 300° C., the gas was not reacted.

Incidentally, the internal pressure of the evaporator of bispentamethylcyclopentadienyl strontium (Sr(Me-Cp)$_2$·THF$_2$) was optimally from 30 to 50 Torrs, but the reaction could be carried out even at a low temperature of about 100 Torrs. When the pressure was higher than 100 Torrs, on the other hand, the vaporization quantity decreased and the film formation rate dropped.

Thereafter, the glass substrate 11 was again conveyed into the zinc sulfide (ZnS) film formation chamber 20 was kept at a predetermined temperature. After the inside of the zinc sulfide (ZnS) film formation chamber 20 was brought into the reduced pressure atmosphere by the pump 27, zinc sulfide constituting the luminescent layer 14 having a film thickness of not greater than 150 nm was formed in the same way as the formation method of zinc sulfide (ZnS) described above.

Transfer between the zinc sulfide (ZnS) film formation chamber 20 and the strontium sulfide (SrS) film formation chamber 26 was carried out by keeping the total pressure of both of the reaction chambers constant, and in order to prevent dissociation of sulfur of the resulting film of the luminescent layer, the atmosphere was hydrogen sulfide (H$_2$S) diluted by hydrogen (H$_2$) used for the film formation.

As described above, the light emission layer 14 consisting of zinc sulfide/strontium sulfide/zinc sulfide (ZnS/SrS/ZnS) three layers was formed in the metal organic chemical vapor deposition apparatus 40 shown in FIG. 2, and two sets of the reaction furnaces which were connected to each other were partitioned by a gate valve 42. Further, the pressure of each film formation chamber was confirmed by a pressure gauge 43a, 43b.

The glass substrate 11 shown in FIG. 2 was fixed to a susceptor equipped with a thermostat, not shown, and the temperature was controlled by feedback control using a thermocouple.

Next, the second insulating layer 15 consisting of tantalum pentaoxide (Ta$_2$O$_3$) was formed on the luminescent layer 14 described above in the same way as the first insulating layer 13. The second transparent electrode 16 consisting of a zinc oxide (ZnO) film was then formed on the second insulating layer 15 in the same way as the first transparent electrode 12 described above.

The first and second transparent electrodes 12, 16 were 300 nm thick, the first and second insulating layers 13, 15 were 400 nm thick, and the luminescent layer 14 was 800 nm thick in total.

Figure 3:
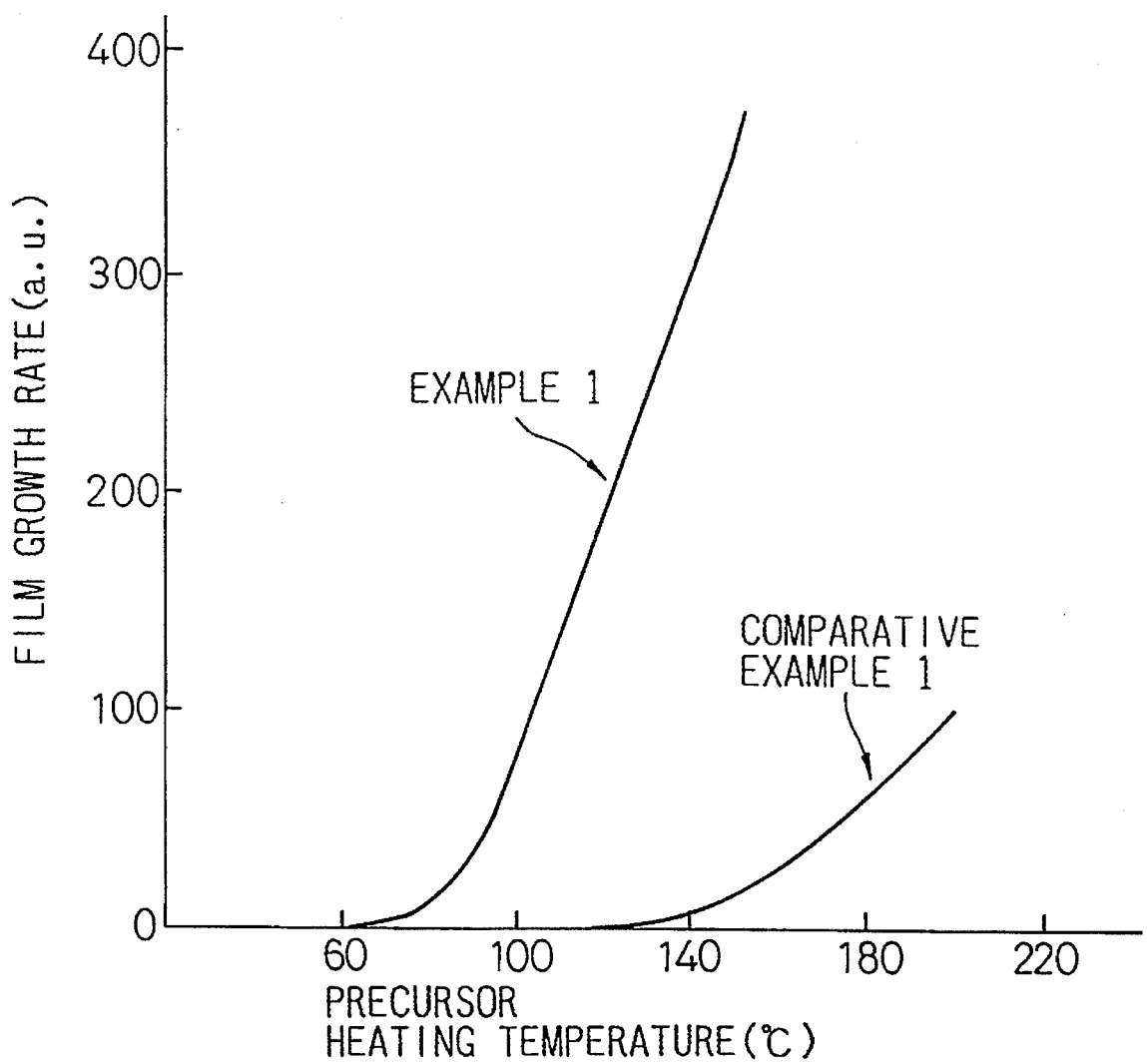
FIG. 3 is a characteristic diagram showing a growth rate of the luminescent layer of the electroluminescent device according to the first embodiment of the present invention with respect to a heating temperature of a precursor strontium.

In the samples thus fabricated, the film formation rate of strontium sulfide (SrS) as the luminescent layer was shown in FIG. 3 in comparison with Comparative Example 1.

Comparative Example 1 shown in FIG. 3 represents the film formation rate of the strontium sulfide (SrS) thin film when produced using bis-dipivaloylmethanized strontium (Sr·(DPM)$_2$), hydrogen sulfide (H$_2$S) and tridipivaloylmethanized cerium (Ce·(DPM)$_3$) as the starting gases for forming the luminescent layer.

As shown in FIG. 3, in the sample produced according to Example 1 of the present invention, the film formation rate of at least three times could be obtained at all the temperatures for heating and vaporizing the strontium compound starting material when the film of strontium sulfide (SrS) was formed by using bis-pentamethylcyclopentadienyl strontium (Sr(Me-Cp)$_2$·THF$_2$) as the strontium precursor and hydrogen sulfide (H$_2$S), in comparison with bis-dipivaloylmethanized strontium (Sr(DRM)$_2$) as the strontium precursor used for the film formation in Comparative Example 1.

When the concentration of the luminescent center added into the strontium sulfide luminescent layer of the sample produced in the same way as described above was confirmed by EPMA (Electron Probe Microanalysis), no error could be confirmed from the set addition amount even when measurement was repeated many times.

Figure 4:
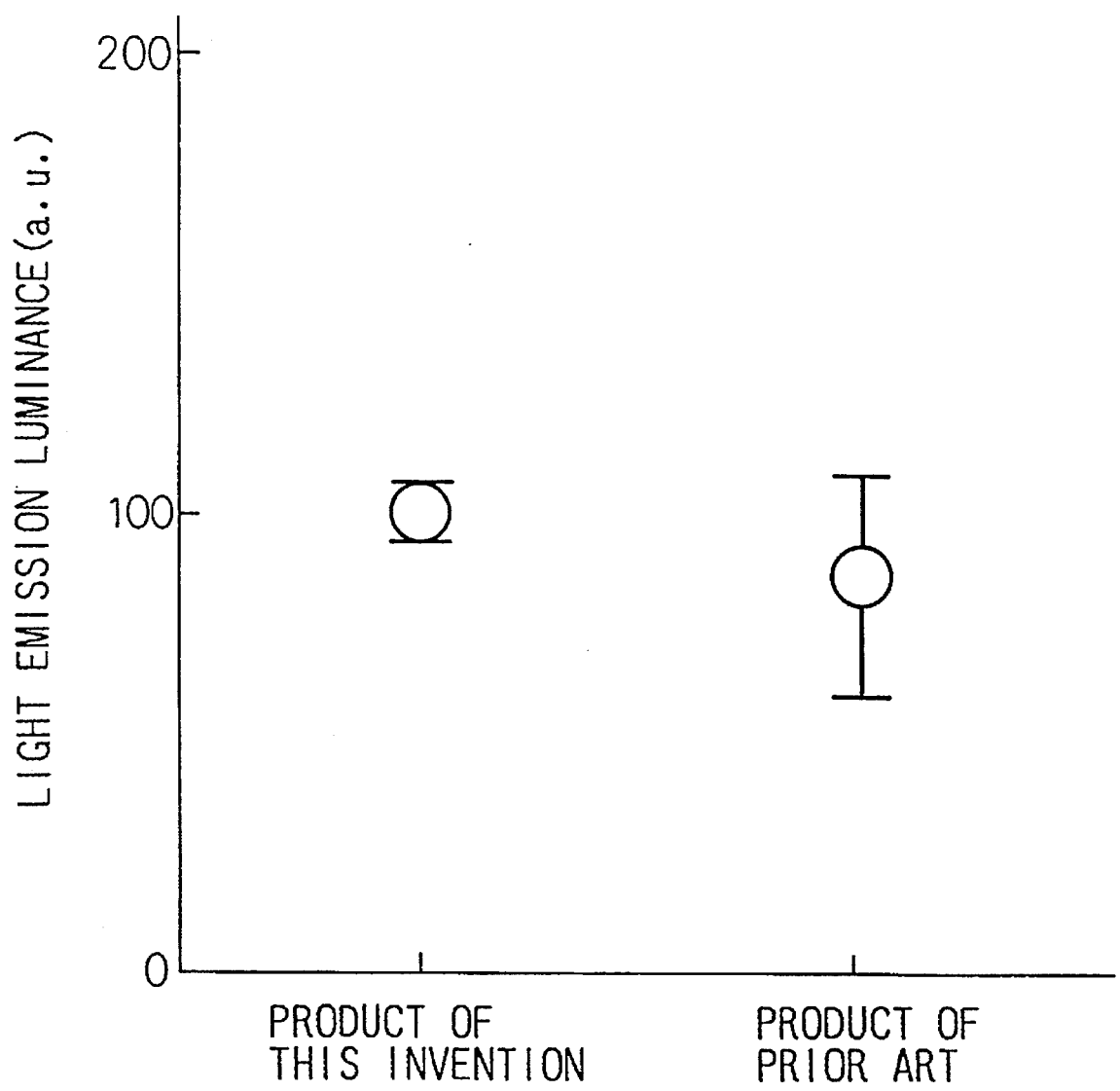
FIG. 4 is a diagram showing variance of light emission luminance of the electroluminescent devices according to the first embodiment in comparison with a prior art method.

FIG. 4 shows light emission luminance, inclusive of variance of luminance, of the EL device thus produced in comparison with that of Comparative Example 1.

In FIG. 4, a circle o represents a mean value of light emission luminance, the upper line on the circle represents the light emission luminance of the EL device having the highest luminance, and the lower line below the circle represents the light emission luminance of the EL device having the lowest luminance.

As described above, when both of them were compared, variance between the EL devices could be remarkably reduced, although a remarkable improvement in the light emission luminance could not be confirmed.

In the manner described above, the EL devices having higher reliability than Comparative Example 1 could be produced with high reproducibility.

EXAMPLE 2

The first transparent electrode, the first insulating layer, the second insulating layer and the second transparent electrode were formed in the same way as in Example 1.

Bis-pentamethylcyclopentadienyl strontium (Sr·(MeCp)$_2$THF$_2$) and hydrogen sulfide (H$_2$S) were used as the materials for forming the base of the luminescent layer, and tridipivaloylmethanized cerium (Ce(DPM)$_3$) was used as the luminescent center.

In this Example 2, the strontium sulfide (SrS) thin film luminescent layer was formed by introducing hydrogen chloride (HCl) as the halogen or halogenated hydrogen gas into the reaction furnace.

Figure 5:
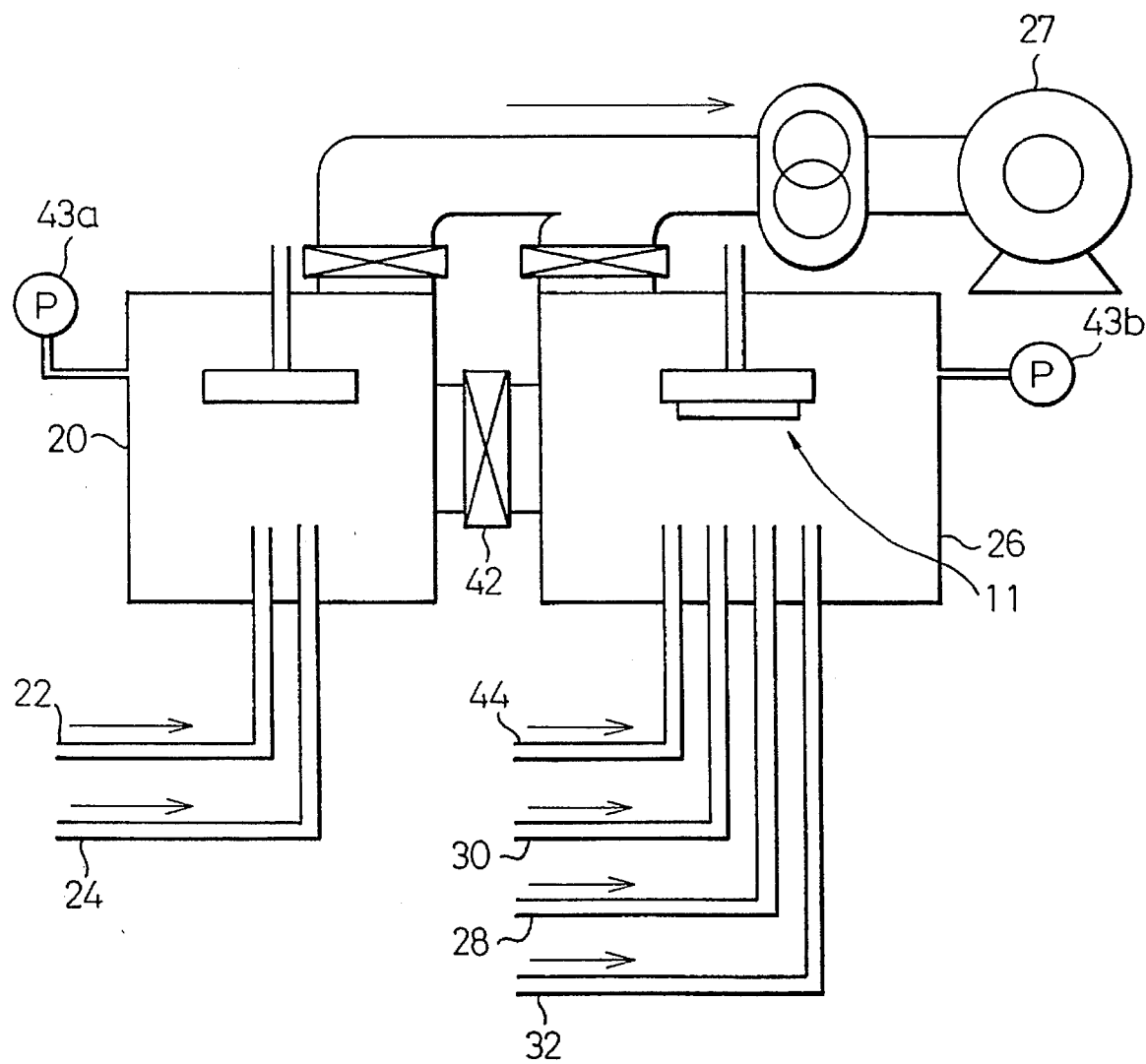
FIG. 5 is a schematic view of a metal organic chemical vapor deposition apparatus used for forming a luminescent layer of an electroluminescent device according to the second embodiment of the present invention.

More definitely, this embodiment used the metal organic chemical vapor deposition apparatus shown in FIG. 5.

In other words, the glass substrates on which the films up to the zinc sulfide (ZnS) thin film were formed was produced in the same way as in Example 1 and was kept at a predetermined temperature not higher than 550° C., and the strontium sulfide (SrS) film formation chamber 26 was held under the reduced pressure atmosphere. Thereafter, the gas of bis-pentamethylcyclopentadienyl strontium (Sr·(MeCp)$_2$THF$_2$) was introduced into the SrS film formation chamber 26 through the third inlet pipe 28 using the hydrogen carrier gas, and the hydrogen sulfide (H$_2$S) gas diluted with hydrogen was introduced into the SrS film formation chamber 26 by the fourth inlet pipe 30.

The vaporization temperature of the precursor and the vaporization pressure at this time were the same as those in Example 1. As the method of adding the luminescent center, tridipivaloylmethanized cerium (Ce·(DPM)$_3$) was used in the same way as in Example 1 and was introduced into the SrS film formation chamber 26 with the hydrogen carrier through the fifth inlet pipe 32. Simultaneously with the introduction of this luminescent center, the hydrogen chloride (HCl) gas diluted with hydrogen (H$_2$) was introduced through the sixth inlet pipe 44 separately from the gas system described above.

Figure 6:
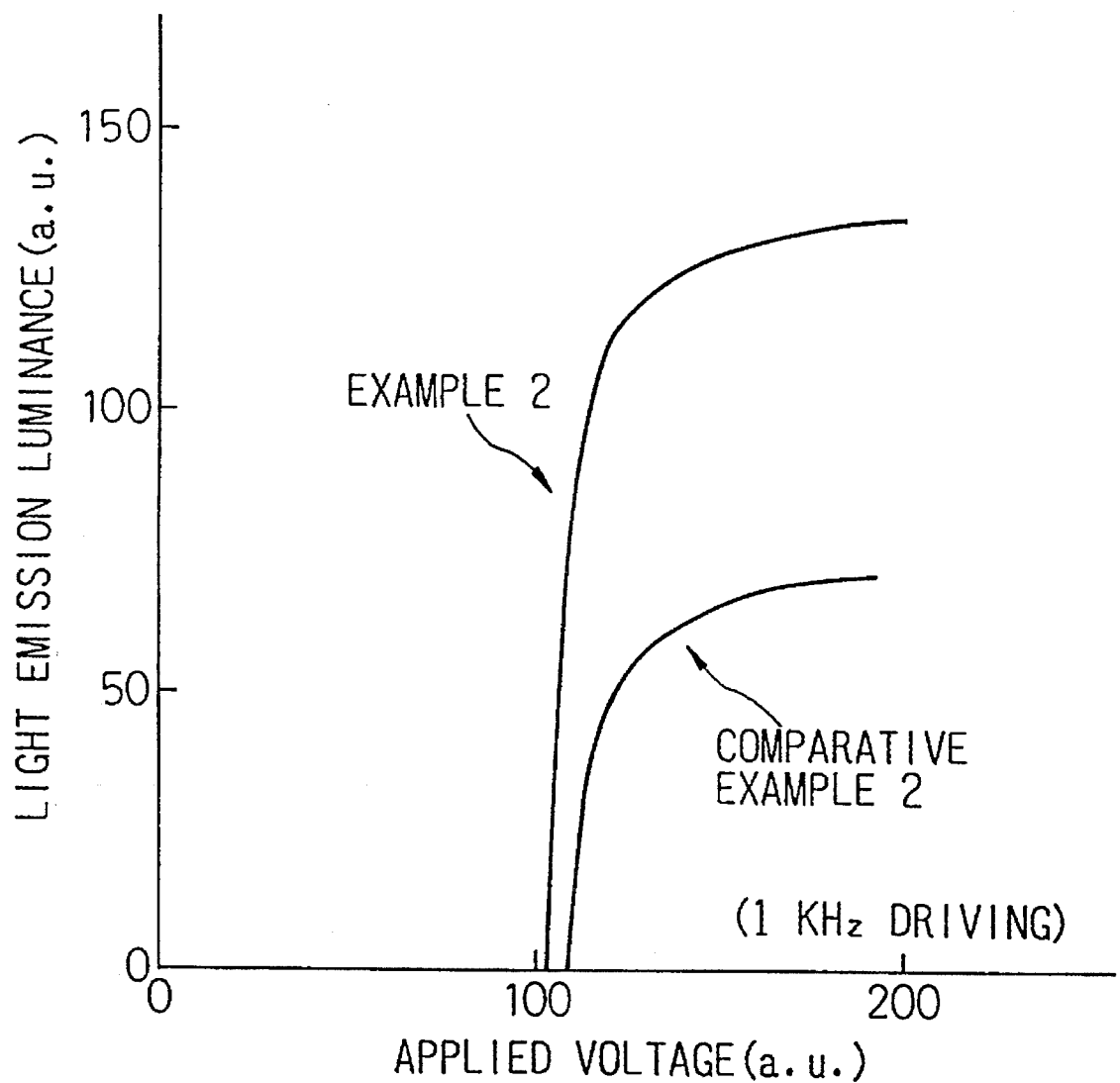
FIG. 6 is a characteristic diagram showing an applied voltage to the electroluminescent device according to the second embodiment and EL light emission luminance.
Figure 7:
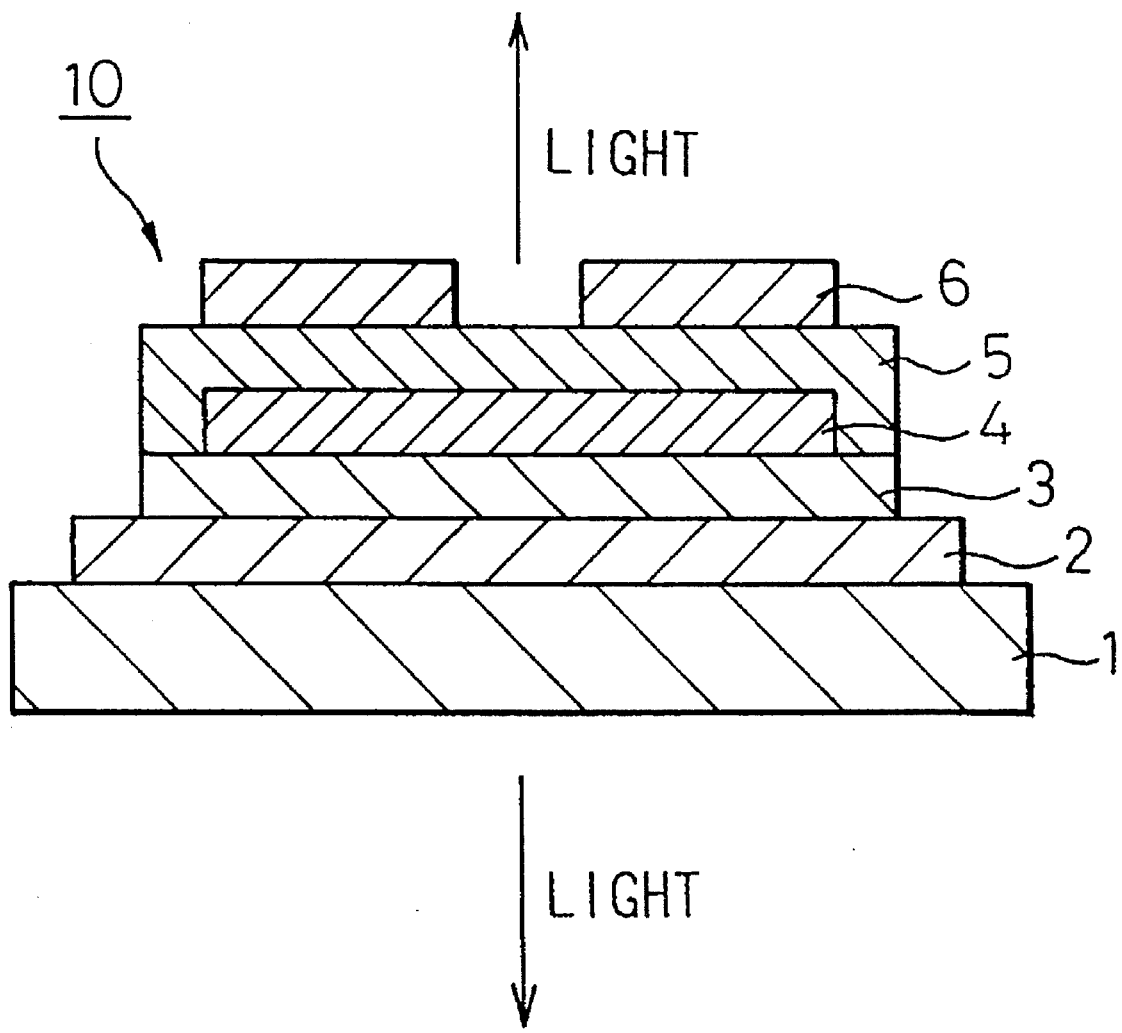
FIG. 7 is a schematic view showing a longitudinal section of an electroluminescent device according to the prior art.

FIG. 6 shows the result of measurement of light emission luminance of the EL device assembled and produced into the device structure shown in FIG. 1 in the same way as in Example 1.

In Comparative Example 2 shown in FIG. 6, hydrogen chloride (HCl) was not introduced at the time of formation of the strontium sulfide (SrS) luminescent layer.

As can be seen from the characteristic diagram of FIG. 6, improvement of about two times in light emission luminance could be confirmed in comparison with the prior art products.

As described above, the present invention can realize the EL devices having higher luminance than those produced by the conventional methods.

We claim:

1. A process for producing an electroluminescent device comprising a luminescent layer located between two electrodes formed on an insulating substrate,
   wherein the luminescent layer comprises a host material to which a luminescent center element is added and the host material is composed of an alkaline earth metal element selected from the group consisting of Be, Mg, Ca, Sr, Ba and Ra, and a second element selected from the group consisting of O, S, Se, Te and Po,
   which process comprises forming the host material by chemical vapor deposition to react a first gas of an organic compound containing the alkaline earth metal element and a second gas of a compound containing the second element in a reactor, the first gas being formed from a cyctopentadienyl compound.

2. A process according to claim 1, wherein a third gas of a compound containing the luminescent center element is reacted with the first gas and the second gas in the reactor, thereby doping the host material with the luminescent center element.

3. A process according to claim 2, wherein the third gas the first gas and the second gas are fed into the reactor through separate feed lines.

4. A process according to claim 2, further comprising a fourth gas of a halogen or gas of a hydrogen halide fed into the reactor during the reaction.

5. A process according to claim 4, wherein the fourth gas is fed into the reactor through a separate feed line.

6. A process according to claim 5, wherein the fourth gas is hydrogen chloride.

7. A process according to claim 1, wherein the second gas is selected from the group consisting of gases of a sulfur compound and gases of a selenium compound.

8. A process according to claim 7, wherein the sulfur compound is hydrogen sulfide and the selenium compound is hydrogen selenide.

9. A process according to claim 1, wherein the substrate has a temperature in a range of from 300° to 550° C. at the time of the formation of the luminescent layer.

10. A process according to claim 1, wherein the cyclopentadienyl compound is vaporized under a pressure of not higher than about 100 Torr.

11. A process according to claim 1, wherein the first gas and the second gas are fed into the reactor through separate feed lines.

12. A process according to claim 1, further comprising a fourth gas of a halogen or gas of a hydrogen halide fed into the reactor during the reaction.

13. A process according to claim 12, wherein the fourth gas is fed into the reactor through a separate feed line.

14. A process according to claim 13, wherein the fourth gas is hydrogen chloride.

15. A process for producing an electroluminescent device comprising a luminescent layer located between two electrodes formed on an insulating substrate,
   wherein the luminescent layer comprises a host material to which a luminescent center element is added and the host material is composed of an alkaline earth metal element selected from the group consisting of Be, Mg, Ca, Sr, Ba and Ra, and a second element selected from the are consisting of O, S, Se, Te and Po,
   which process comprises forming the host material by chemical vapor deposition to react a first gas of an organic compound containing the alkaline earth metal element and a second gas of a compound containing the second element in a reactor,
   the first gas being formed from a cyclopentadienyl compound selected from the group consisting of bis-pentamethylcyclopentadienyl strontium-THF adduct, bis-pentamethylcyclopentadienyl calcium-THF adduct and bis-pentamethylcyclopentadienyl barium-THF adduct.

16. A process according to claim 15, wherein the cyclopentadienyl compound is bis-pentamethylcyclopentadienyl strontium-THF adduct.

17. A process for producing an electroluminescent device comprising a luminescent layer located between two electrodes formed on an insulating substrate, wherein the luminescent layer comprises a host material to which a luminescent center element is added and the host material is composed of an alkaline earth metal element selected from the group consisting of Be, Mg, Ca, Sr, Ba and Ra, and a second element selected from the group consisting of O, S, Se, Te and Po, which process comprises forming the host material by chemical vapor deposition to react a first gas of an organic compound containing the alkaline earth metal element and a second gas of a compound containing the second element in a reactor, the first gas being formed from a cyclopentadienyl compound, and reacting at bird gas of a compound containing the luminescent center element, composed of tridipivaloylmethanized cerium, with the first gas and the second gas in the reactor, thereby doping the host material with the luminescent center element.

* * * * *